United States Patent [19]

Maier

[11] Patent Number: 4,625,229

[45] Date of Patent: Nov. 25, 1986

[54] ARRANGEMENT FOR PERMITTING RAPID COOLING OF AN ELECTRONIC COMPONENT OPERABLE AT LOW TEMPERATURES

[75] Inventor: Horst Maier, Heilbronn, Fed. Rep. of Germany

[73] Assignee: Telefunken Electronic GmbH, Heilbronn, Fed. Rep. of Germany

[21] Appl. No.: 660,315

[22] Filed: Oct. 12, 1984

[30] Foreign Application Priority Data

Oct. 13, 1983 [DE] Fed. Rep. of Germany ....... 3337195

[51] Int. Cl.⁴ ...................... F25B 19/00; H01L 25/04
[52] U.S. Cl. ....................................... 357/81; 357/83; 62/514 JT; 250/352
[58] Field of Search ............... 62/514 R, 514 JT; 357/83; 250/352

[56] References Cited

U.S. PATENT DOCUMENTS

| | | | |
|---|---|---|---|
| 2,951,944 | 9/1960 | Fong | 250/352 |
| 3,495,419 | 4/1968 | Hart | 62/514 JT |
| 3,595,982 | 7/1971 | Kafka | 174/15 |
| 3,926,011 | 12/1975 | Sollami | 62/514 JT |
| 3,939,706 | 2/1976 | Pinson | 250/352 |
| 4,479,367 | 10/1984 | Buller | 62/514 R |
| 4,509,342 | 4/1985 | Van Antwerpen | 250/352 |

FOREIGN PATENT DOCUMENTS

| | | |
|---|---|---|
| 1936609 | 2/1970 | Fed. Rep. of Germany . |
| 3138521 | 3/1983 | Fed. Rep. of Germany . |
| 2119071 | 11/1983 | United Kingdom ........... 62/514 JT |
| 1040548 | 9/1983 | U.S.S.R. ............................... 357/83 |

OTHER PUBLICATIONS

IBM Technical Disclosure Bulletin, vol. 25, No. 7B, p. 3606 (Dec. 1982).
Physics Today, pp. 96–97, Jan. 1982.
Infrared Detectors for Military Applications, Mullard Ltd publication, p. cover–16 (not dated).

*Primary Examiner*—James W. Davie
*Assistant Examiner*—Vangelis Economou
*Attorney, Agent, or Firm*—Spencer & Frank

[57] ABSTRACT

The invention relates to an arrangement for an electronic component operable at low temperatures, in particular, to a radiation sensitive semiconductor component. The arrangement consists of a housing for the component and of a cooler which is in communication with the housing and operates in accordance with the Joule-Thomson effect. The invention consists in that there is arranged between the cooler and the adjacent housing wall a super-insulation comprised of a single- or multi-layered foil with low thermal conductivity and capacity and high thermal-transfer resistance.

9 Claims, 2 Drawing Figures

ARRANGEMENT FOR PERMITTING RAPID COOLING OF AN ELECTRONIC COMPONENT OPERABLE AT LOW TEMPERATURES

BACKGROUND OF THE INVENTION

The invention relates to an arrangement for an electronic component which is operable at low temperatures and consists of a housing for the component and a cooler which is in communication with the housing and operates in accordance with the Joule-Thomson effect.

Electronic miniature components which reach their optimum electric characteristic data only at temperatures below room temperature are required for many uses. Examples thereof are semiconductor detectors made of mercury-cadmium-telluride or of lead-tin-telluride which reach their optimum light sensitivity only at approximately 80 degrees Kelvin. Twin-walled, evacuated housings with a radiation transmitting window above the semiconductor component are frequently used for such semiconductor components. If extremely brief cooling times and moderate operating periods are required it is possible to use housings which are not evacuated. In this case the cooler required for cooling down the electronic component preferably operates in accordance with the Joule-Thomson principle and is of cylindrical or conical shape, with different cone angles being feasible.

According to the Joule-Thomson effect, a suitable gas, for example, air, argon or nitrogen, cools off when it exits from a nozzle opening under high pressure and expands. The gas cooling down during expansion is preferably conducted away at a suitably placed capillary through which the gas is directed towards the nozzle opening, so that the gas which is guided inside the capillary is pre-cooled. The capillary preferably consists of a pipe coil arranged on a cylindrical or conical carrier member.

There should be a close contact between the aforementioned pipe coil and the adjacent housing wall for the electronic component to ensure that the return flow of the expanded gas also moves along a spiral-shaped path, and an effective heat exchange occurs between the cooled returning gas and the gas supplied under high pressure.

The spiral-shaped flow of the returning gas can, however, only be achieved if there is good sealing between the pipe coil and the adjacent outside wall of the housing for the electronic component. This, in turn, makes good thermal contact with the housing for the electronic component unavoidable, which causes a reduction in the pre-cooling of the gas supplied and interference in the optimum temperature profile along the capillary. As a consequence, the cooling of the electronic component is slowed down in an undesired manner.

SUMMARY OF THE INVENTION

The object underlying the invention is to indicate an arrangement consisting of a housing for an electronic component and a cooler, wherein the pre-cooling of the gas supplied is improved, and, consequently, the cooling down time of the component may be shortened. This object is attained in accordance with the invention by arranging between the cooler and the adjacent housing wall a superinsulation which thermally insulates with its low thermal conductivity and capacity and the high transfer resistance the gas chamber for the expanded gas from the housing.

This arrangement is preferably used for radiation sensitive semiconductor components, in particular, infrared detectors. These infrared detectors are cooled down to approximately 80 degrees Kelvin. The superinsulation consists of a single- or multi-layered foil placed between the cooler and the housing wall. A foil with up to ten layers may, for example, be used, with the foil itself having a thickness of between 2 and 20 $\mu$m. The foil may be made of plastic or a metal with low thermal conductivity and is preferably wound from one strip or composed or single, closed rings arranged in layers on top of one another. Polyimide or oxidized aluminum have, for example, proven to be well suited as foil material. The various foil layers of the superinsulation lie loosely on top of one another and are kept in position by the predetermined bearing pressure of the cooler against the housing wall.

BRIEF DESCRIPTION OF THE DRAWINGS

The invention will now be explained in greater detail with reference to an embodiment example.

The set-up of the arrangement according to the invention is shown in principle in FIG. 1.

DESCRIPTION OF THE PREFERRED EMBODIMENTS

Figure 1:
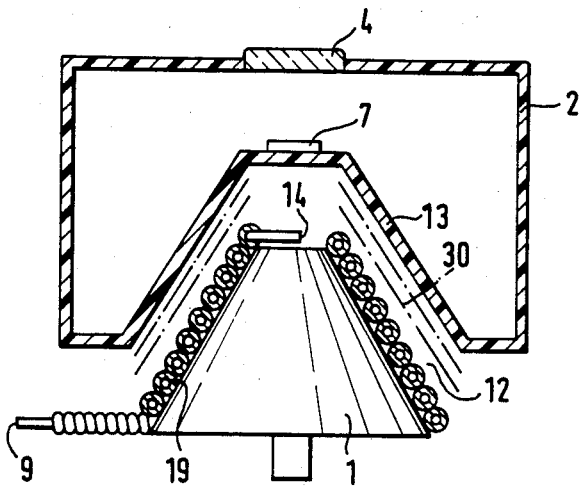

In FIG. 1 there is shown a cooler 1 consisting of a conical carrier member on whose outside wall there is wound a pipe coil 19 through which the gaseous cooling agent, for example, air, argon or nitrogen is conducted. This gas is supplied to the cooling coil under high pressure at the inlet opening 9 and exits from the nozzle opening 14 beneath the electronic component 7 to be cooled.

A housing 2 which may either be evacuated or, in the case of components with short operating times, be filled with air or another gas, is provided for the electronic component 7. If the electronic component 7 is a radiation sensitive semiconductor component, in particular, an infrared detector, the housing 2 comprises above the semiconductor component a radiation transmitting window 4 which may, for example, consist of germanium. The semiconductor housing 2 comprises a conical recess 12 which corresponds to the cone of the cooler 1 and is intended for accommodation of this cooler. The cooler is pressed into this recess with a defined bearing pressure, causing the exiting gas to flow out between the housing wall 13 in the area of the recess 12 and the pipe coil 19, thus pre-cooling the gas supplied in the pipe coil. According to the invention, there is arranged between the cooler 1 and the housing wall 13 the superinsulation 30 which may, for example, consist of a loosely wound multi-layered foil made of polyimide or of a metal with an oxidized surface with low thermal conductivity and extremely low thermal capacity. By pressing the cooler 1 into the recess 12 of the housing, the superinsulation 30 is held in its position, which causes the expanded returning gas to flow between the superinsulation and the pipe coil and to leave the bottom plate 8 through the outlet 10.

By using the superinsulation, a reduction of the cooling effect by the thermal capacity and the thermal conductivity of the housing 2 is almost completely prevented since the thermal contact between the cooling agent and the housing wall is reduced to an extremely high extent.

Figure 2:
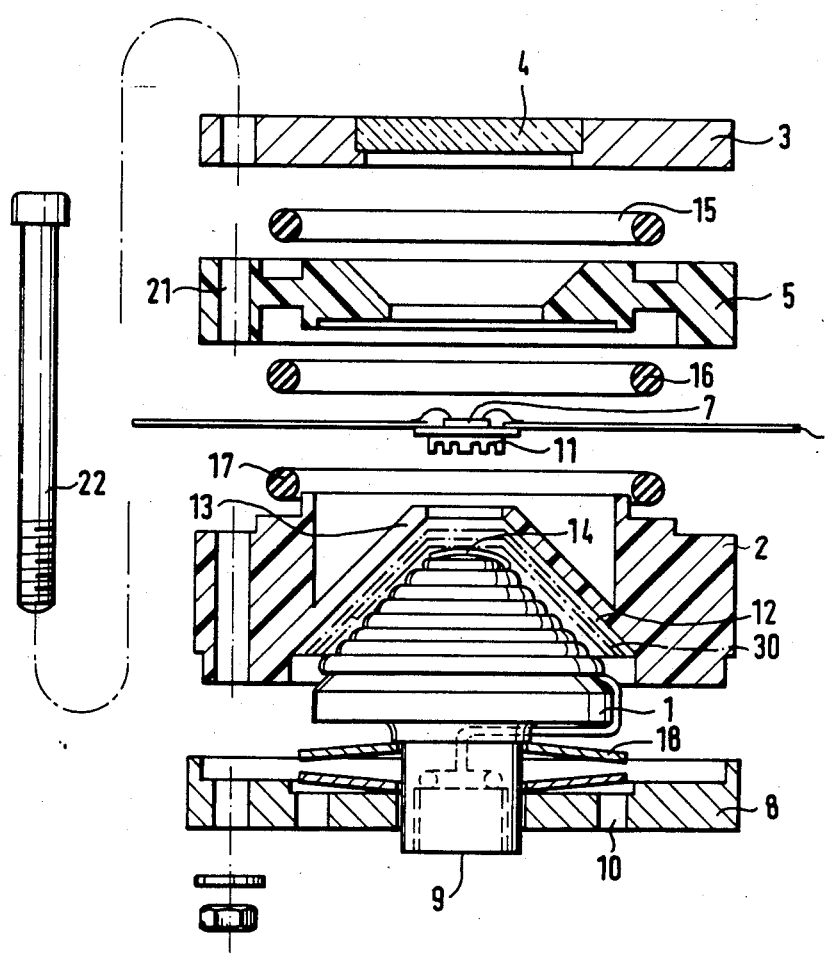
FIG. 2 shows a special embodiment for an infrared detector component with a short cooling down time and a brief operating time.

FIG. 2 shows a housing for an infrared detector which has to be cooled down within a few seconds and which has a short operating time of no more than a few minutes. In such arrangements it is not necessary for the housing to be evacuated.

The cooler 1 again supports the pipe coil 19 with its inlet opening 9 and outlet opening 14 opposite the carrier member 11 for the semiconductor component 7. The carrier member 11 simultaneously closes off the cone-shaped recess 12 for accommodation of the cooler 1 from the interior of the housing. The housing consists of various sections: section 2 with the cone-shaped recess 12, the intermediate section 5, between which and the housing section 2 the leads 6 which may, for instance, be band-shaped, are conducted out of the housing. The housing is closed by a cover plate 3 containing the radiation transmitting window 4. The cooler is pressed into the recess 12 of the housing section 2 with the aid of the bottom plate 8, with the superinsulation 30 consisting of a foil wound from a single or several layers or with superimposed layers, being arranged between the pipe coil 19 of the cooler and the outside wall 13 of the housing section 2. Springs, for example, Belleville springs 18 arranged between the bottom plate 8 and the cooler cone are used to create a defined bearing pressure of the cooler against the housing. All of the sections are fastened firmly and tightly to one another, for example, by screws 22 which are inserted through corresponding openings 21 of the various housing sections. The sealing rings 15, 16 and 17 which may, for example, be made of rubber or indium, and which are inserted into corresponding grooves of the housing sections serve to seal the housing sections.

The housing sections 2 and 5 preferably consist of a material of low thermal conductivity with low thermal capacity so as to further improve the insulating effect with respect to the returning pre-cooled gas along the outside wall of the pipe coil. Since the superinsulation does, however, already effect a very good thermal separation, sections 2 and 5 may also be manufactured from a material with relatively good thermal conductivity and quite high thermal capacity.

The cover plate 3 containing the radiation transmitting window 4 is preferably made of a material with good thermal conductivity and high thermal capacity in order to avoid fogging up of the transparent window 4 during the intended short operating time.

With the housing shown in FIG. 2, it was possible to achieve cooling down times of less than one second. Operating times of several minutes are possible with a housing interior filled with air or inert gas.

What is claimed is:

1. Arrangement for an electronic component which is operable at low temperatures and comprises a housing for the component and a cooler having a nozzle opening, the cooler being in communication with the housing so that a gas chamber exists around the cooler, the cooler operating in accordance with the Joule-Thomson effect in that gas under pressure flows through the cooler, and exits from the nozzle opening while expanding, and the resulting expanded gas flows through the gas chamber in thermal contact with gas under pressure flowing through the cooler, wherein there is arranged between the cooler (1) and the adjacent housing wall (13) a superinsulation foil body (30) which is structurally independent of the housing and which is constructed to have, between the cooler and the adjacent housing wall, a low thermal conductivity and capacity and a high thermal-transfer resistance, for thermally insulating the gs chamber for the expanded gas from the housing (2).

2. Arrangement according to claim 1, in combination with an electronic component constituted by a radiation sensitive semiconductor component.

3. Arrangement according to claim 1, wherein the foil body is a single- or multi-layered body between the cooler (1) and the housing wall (13).

4. Arrangement according to claim 3, wherein the superinsulation body consists of a 10-layer foil.

5. Arrangement according to claim 3, wherein the foil body has a thickness of between 2 and 20 $\mu$m.

6. Arrangement according to claim 3, wherein the foil body is made of plastic material or a metal with low thermal conductivity.

7. Arrangement according to claim 6, wherein the foil body is made of polyimide or of oxidized aluminum.

8. Arrangement according to claim 3, wherein the foil body is multi-layered and the various foil layers of the superinsulation are loosely arranged on top of one another and are kept in their position by the predetermined bearing pressure of the cooler.

9. Arrangement according to claim 3, wherein the foil body is multi-layered and the multi-layered foil is wound from one strip or consists of single closed rings which are arranged in layers on top of one another.

* * * * *